United States Patent
Shima et al.

(10) Patent No.: US 8,487,415 B2
(45) Date of Patent: Jul. 16, 2013

(54) RECTIFIER AND PROCESS FOR PRODUCING THE RECTIFIER

(75) Inventors: Hisashi Shima, Tsukuba (JP); Hiroyuki Akinaga, Tsukuba (JP); Shoji Ishibashi, Tsukuba (JP); Tomoyuki Tamura, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/740,460

(22) PCT Filed: Oct. 30, 2008

(86) PCT No.: PCT/JP2008/069710
§ 371 (c)(1),
(2), (4) Date: Jul. 26, 2010

(87) PCT Pub. No.: WO2009/057671
PCT Pub. Date: May 7, 2009

(65) Prior Publication Data
US 2010/0276684 A1   Nov. 4, 2010

(30) Foreign Application Priority Data

Oct. 30, 2007   (JP) .................................. 2007-281740
Oct. 27, 2008   (JP) .................................. 2008-275222

(51) Int. Cl.
*H01L 29/861*   (2006.01)
(52) U.S. Cl.
USPC .................... 257/658; 257/928; 257/E21.358
(58) Field of Classification Search
USPC .................... 257/658, E25.002, E21.358, 925
See application file for complete search history.

(56) References Cited

U.S. PATENT DOCUMENTS
2007/0257257 A1   11/2007   Cho et al.

FOREIGN PATENT DOCUMENTS
| JP | 2006-086310 | 3/2006 |
| JP | 2007-227922 | 9/2007 |
| JP | 2007-281208 | 10/2007 |

OTHER PUBLICATIONS

Park, I.S. et al, Resistance switching characteristics for nonvolatile memory operation of binary metal oxides, Japanese Journal of Applied Physics, Apr. 24, 2007, vol.46, No. 4B, pp. 2172-2174.*

(Continued)

*Primary Examiner* — Julio J Maldonado
*Assistant Examiner* — Amar Movva
(74) *Attorney, Agent, or Firm* — Cooley LLP

(57) ABSTRACT

The present invention provides a rectifier element that has a titanium oxide layer interposed between first and second electrodes containing a transition metal with an electronegativity larger than that of Ti, wherein, in the titanium oxide layer, only the interface on the side facing any one of the electrodes has a stoichiometric composition, and wherein the average composition of the whole layer is represented by the formula $TiO_x$ (wherein x satisfies the relationship $1.6 \leq x < 2$), and wherein the rectifying characteristics can be reversed by applying a reverse electrical signal that exceeds the critical reverse electric power between the first and second electrodes in an opposite direction. The present invention also provides a process for producing a rectifier element, which includes the steps of depositing a first electrode that contains a transition metal with an electronegativity larger than that of Ti on a substrate; depositing a layer of titanium oxide ($TiO_x$, wherein x satisfies the relationship $1.6 \leq x < 2$) on the first electrode; exposing the surface of the titanium oxide ($TiO_x$) layer to oxygen atmosphere; and depositing a second electrode containing a transition metal with an electronegativity larger than that of Ti on the surface of the titanium oxide ($TiO_x$) layer exposed to the oxygen atmosphere.

5 Claims, 8 Drawing Sheets

OTHER PUBLICATIONS

Cho et al., First-principles study of point defects in rutile TiO(2-x), Physical Review, American Physical Society Edition B vol. 73, p. 193202, Published May 9, 2006.*

Yang et al., Memristive switching mechanism for metal/oxide/metal nanodevices, Published Jun. 15, 2008, Nature Nanotechnology, Macmillian Publishers, p. 429.*

Park, et al. "Resistance switching characteristics for non-volatile memory operation of binary metal oxides." JP J. Applied Physics. vol. 46, No. 4B, pp. 2172-2174 (2007).

Jameson, et al., "Field-programmable rectification in rutile $TiO_2$ crystals." Applied Physics Letters 91, 112101 (2007).

PCT/JP2008/069710. Applicant: National Institute of Advanced Industrial Science and Technology, International Search Report (Jan. 27, 2009).

* cited by examiner

RECTIFIER AND PROCESS FOR PRODUCING THE RECTIFIER

CROSS REFERENCE TO RELATED APPLICATIONS

This application claims priority to international patent application no. PCT/JP2008/069710 filed on Oct. 30, 2008, entitled, "Rectifier and Process for Producing the Rectifier", which claims priority to Japanese patent application no. 2008-0275222 filed on Oct. 27, 2008 and Japanese patent application no. 2007-0281740 filed on Oct. 30, 2007, the contents of each application is incorporated herein by reference.

TECHNICAL FIELD

The present invention relates to rectifier elements whose rectifying characteristics can be reversed by applying a reverse electrical signal that exceeds the critical reverse electric power, and processes for producing the rectifier elements. More specifically, the present invention relates to rectifier elements whose rectifying characteristics can be reversed by applying a reverse electrical signal that exceeds the critical reverse electric power to a titanium oxide layer interposed between electrodes wherein the two interfaces of the titanium oxide layer have unsymmetrical deviations from a stoichiometric composition, and processes for producing the rectifier elements.

BACKGROUND ART

Rectifying diodes, which are key elements that support present-day electronics, are fabricated from a silicon semiconductor, gallium arsenide semiconductor, or such. Rectifying diodes typically possess two resistance values in the forward bias direction and the reverse bias direction, using the p-n junction.

Meanwhile, there is a known technique that provides rectifying function within the voltage range of about −5 V to +5 V by placing two Pt electrodes on the surface of a rutile-type $TiO_2$ single crystal, and applying a large electric power of 75 V/180 s between the electrodes (see Non-patent Document 1).

Furthermore, resistance switching devices that are capable of non-volatile memorization of low and high resistance states by placing two-terminal ohmic electrodes on a single crystal of $Ti_4O_7$ or such having a rutile-type crystal structure, and applying two threshold voltages, have been disclosed (see Patent Document 1).
[Patent Document 1] Japanese Patent Application Kokai Publication No. (JP-A) 2006-86310 (unexamined, published Japanese patent application)
[Non-patent Document 1] Applied Physics Letters, Vol. 91, 112101 (2007), pages 112101-1 to 112101-3

DISCLOSURE OF THE INVENTION

Problems to be Solved by the Invention

As mentioned above, due to the principle of rectification, conventional rectifying diodes using semiconductor materials have the disadvantage that, once the structure is formed, the direction of rectification is also decided, and this direction cannot be changed afterwards.

On the other hand, the technique exemplified in Non-patent Document 1 is advantageous in that the direction of rectification can be programmed after formation. However, a rutile-type $TiO_2$ single crystal needs to be formed by an ordinary semiconductor process. Additionally, the electric power to be applied for the programming is 75 V/180 s. Therefore, this technique is unrealistic considering its compatibility with an ordinary semiconductor device driver.

Furthermore, although Non-patent Document 1 mentions the presumption that "when a program voltage with a reverse signal is applied, the vacancies are pushed out to the opposite electrode side, and the physical direction of rectification is eventually reversed", no data actually showing the reversal of rectification direction is disclosed.

Therefore, if the programming can be performed only once, the rigidity in which the direction of rectification cannot be changed afterward remains, and the range of programming by users after formation is naturally limited. That is, there is no difference between this technique and a technique in which an ordinary diode is placed in a device in the desired direction from the beginning.

The technique disclosed in Patent Document 1 is only intended for application to a non-volatile memory element, and there is no suggestion on the reversal of rectifying characteristics in this document. The document describes that the compounds to be employed are rutile-type single crystals as in Non-patent Document 1, and the crystals are thin-layered to be compatible with the power-supply voltage; however, their use as diodes is not at all suggested.

Patent Document 1 discloses lowering of the voltage level of applied voltage pulse by doping. However, this document describes that the technique is based on epitaxial growth and the electrodes used are ohmic electrodes. Therefore, there is no suggestion of an unsymmetrical electrode structure having a titanium oxide layer interposed in between, which is disclosed in the present application.

For present-day practical electronic devices for which a wide variety of utilization forms are expected, key elements such as rectifier elements that can be stably and reversibly controlled are desired in order to secure flexibility in ex-post alterations.

Therefore, an objective of the present invention is to provide rectifying diodes whose rectifying characteristics can be optionally regulated by giving an electrical signal even after the elements are produced.

Means for Solving the Problems

The above-mentioned objectives are achieved by the following.
[1] A rectifier element comprising a titanium oxide layer interposed between first and second electrodes comprising a transition metal with an electronegativity larger than that of Ti,
wherein, in the titanium oxide layer, only the interface on the side facing any one of the electrodes has a stoichiometric composition;
wherein the average composition of the whole layer is represented by the formula $TiO_x$ (wherein x satisfies the relationship $1.6 \leq x < 2$); and
wherein the rectifying characteristics can be reversed by applying a reverse electrical signal that exceeds the critical reverse electric power between the first and second electrodes in an opposite direction.
[2] The rectifier element of [1], wherein the transition metal with an electronegativity larger than that of Ti is any one selected from Pt, Au, and Cu.
[3] A process for producing a rectifier element, which comprises the steps of:

depositing a first electrode comprising a transition metal with an electronegativity larger than that of Ti on a substrate, depositing a layer of titanium oxide (TiO$_x$, wherein x satisfies the relationship 1.6≦x<2) on the first electrode, exposing the surface of the titanium oxide (TiO$_x$) layer to oxygen atmosphere, and depositing a second electrode comprising a transition metal with an electronegativity larger than that of Ti on the surface of the titanium oxide (TiO$_x$) layer exposed to the oxygen atmosphere.

[4] A process for producing a rectifier element, which comprises the steps of:

depositing a first electrode comprising Pt on a substrate, depositing a layer of titanium oxide (TiO$_x$, wherein x satisfies the relationship 1.6≦x<2)) on the first electrode, exposing the surface of the titanium oxide (TiO$_x$) layer to oxygen atmosphere, and depositing a second electrode comprising any one selected from Pt, Au, and Cu on the surface of the titanium oxide (TiO$_x$) layer exposed to the oxygen atmosphere.

Effects of the Invention

The present invention not only enables repeated reversal of rectifying characteristics after rectifier production, but also enables optional regulation of current-voltage characteristics within a certain range after the reversal by manipulating the reverse electrical signal. Furthermore, in contrast to Non-patent Document 1, the present invention does not require formation of single crystals, nor preparation of a large power supply of 75 V/180 s in addition to an ordinary device-driving power supply. Moreover, since the forward resistance value can be extremely reduced, the present invention is advantageously applicable to practical devices.

MODE FOR CARRYING OUT THE INVENTION

Figure 1:
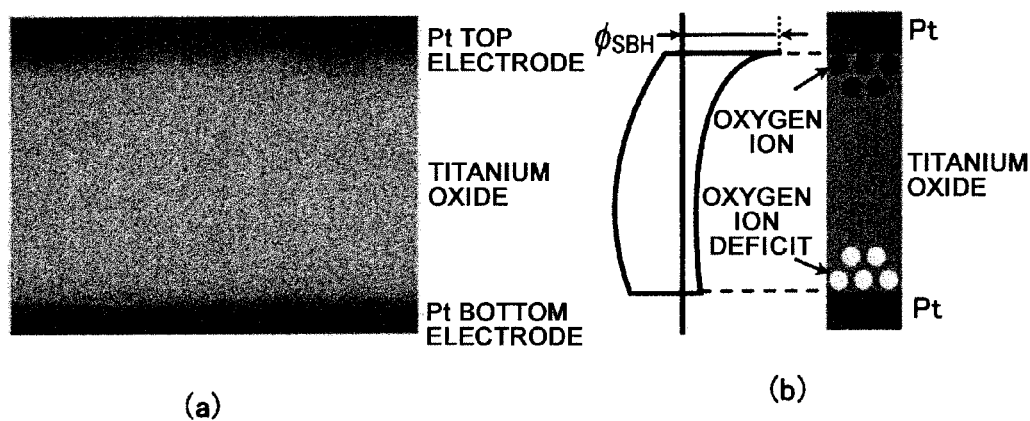
FIG. 1(a) shows a cross-sectional electron microgram of a rectifier element of the present invention.
FIG. 1(b) shows a schematic diagram depicting the band state.

In the present invention, "rectifier element" refers to, for example, an element that has a cross-sectional structure exemplified in FIG. 1(a), and shows a band diagram schematically presented in FIG. 1(b) in the initial state immediately after production. Specifically, in the initial state, it is presumed that: there is an oxygen deficit at least at the side of the Pt bottom electrode, and ohmic contact is established; and in contrast, at the side of the Pt top electrode, oxygen is positioned with respect to the corresponding titanium, and is in a Schottky contact state as in an ordinary metal-semiconductor interface. Therefore, this indicates the rectifying characteristics that current flow from the Pt top electrode to the Pt bottom electrode is easy, but the current flows from the Pt bottom electrode to the Pt top electrode is difficult.

To construct a band diagram of the rectifier, a first principle calculation was carried out. The interfaces shown in FIG. 2 were envisaged. That is, it was assumed that oxygen is present in abundance on the interface in the schematic diagram of (a) on the left side of FIG. 2, and the interface is in a state that is close to complete TiO$_2$. As shown beneath the diagram, the calculation results suggest that the Fermi level (Ef) of Pt corresponds to the bandgap region of TiO$_2$, thus conductivity cannot be obtained, and the interface is in a high resistance state (so-called Schottky contact state).

Figure 2:
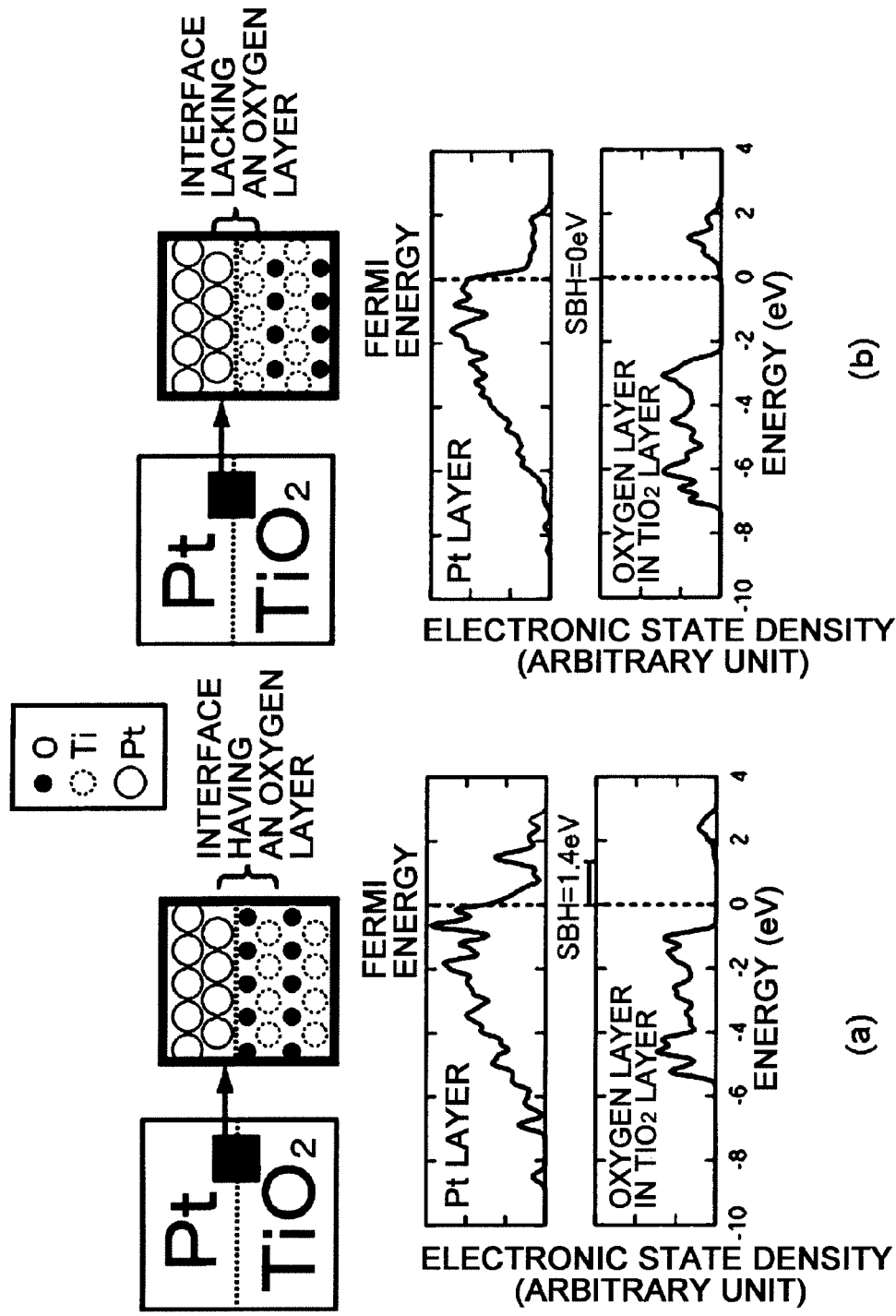
FIG. 2 shows the first principle calculation results for a rectifier element of the present invention.

On the other hand, it was assumed that abundant Ti is present on the interface in the schematic diagram of (b) on the right side of FIG. 2, and the interface is in an oxygen-deficient state (simply said, it is the state in which TiO$_2$ in the left schematic diagram is vertically reversed). In this case, the band of Pt covers the bandgap of TiO$_2$, and the Fermi level (Ef) reaches the edge of the TiO$_2$ conductive band, thus it was presumed that the interface is in a low resistance state (so-called ohmic contact state).

When Ta is, for example, used for the top electrode, it was estimated from calculation results that both interfaces have ohmic contact, and in fact, rectifying characteristics were not obtained. Non-patent Document 1 discloses a rectifier element that has a "Pt/rutile-type TiO$_2$ single crystal/Pt" structure in the initial state. Therefore, it is naturally expected that both interfaces have Schottky contact and high resistance is present in both directions.

Herein, "titanium oxide layer" is, for example, a deposited film produced by reactive sputtering deposition, and is preferably an amorphous deposited film. The film thickness can be appropriately selected to obtain a desired resistance value, and is preferably 20 nm to 40 nm. Furthermore, the composition of the titanium oxide layer is preferably as follows: only the interface on the side facing one of the electrodes has a stoichiometric composition; the interface on the side facing the other electrode is in an oxygen-deficient state; and the average composition of the whole layer is represented by the formula TiO$_x$ (wherein x satisfies the relationship 1.6≦x<2).

In the present invention, "exposing to oxygen atmosphere" is preferably, for example, an annealing treatment in which a substrate is heated to 100° C. to 300° C. under assistance by radicals produced by applying RF electrical power to an oxygen-containing argon gas. However, it may also be mere exposure to the atmosphere for a predetermined time or longer. Any treatment can be employed as long as exposure to oxygen atmosphere allows only the interface on the exposed side to acquire an approximately stoichiometric composition, and the oxygen deficit of the interface is relieved.

For example, the oxygen partial pressure can be regulated when sputtering the titanium oxide layer such that the voltage of the "reverse electrical signal" of the present invention falls within the range of the driving voltage used for ordinary semiconductor devices. Preferably, the absolute value of the voltage is 5 V or more to 10 V or less. It was revealed that an electric power not less than the critical reverse electric power which can be the reverse electrical signal may be applied, and that the current-voltage characteristics after reversal are changed depending on the magnitude of the applied voltage and the duration of the application. More specifically, by regulating the pulse shape of the reverse electrical signal, desired current-voltage characteristics can be obtained within a certain range.

Example 1

Figure 3:
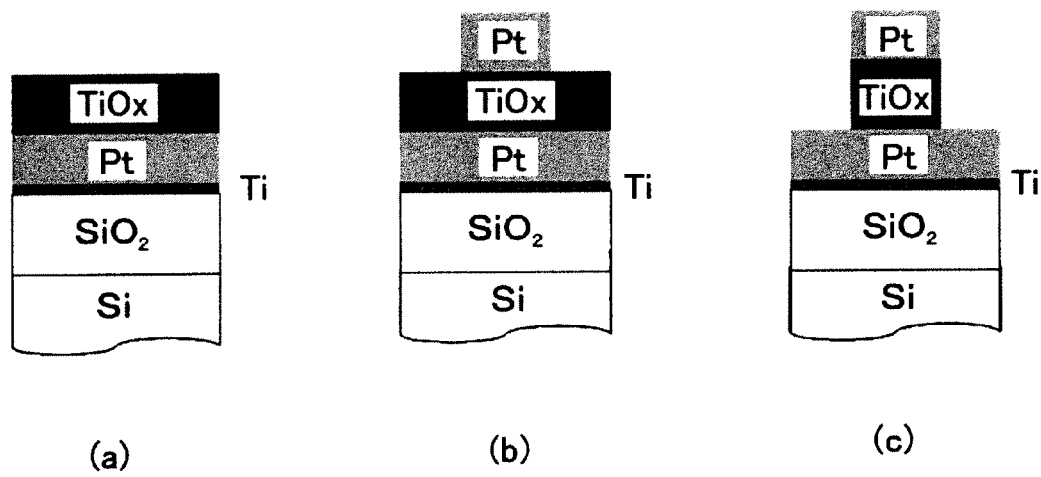
FIG. 3 shows schematic diagrams of the process of producing rectifier elements of the present invention.

Hereinafter, a specific example of the process for producing a rectifier element of the present invention will be described using FIG. 3. First, a Ti layer and a Pt layer were successively deposited by RF magnetron sputtering onto a ready-made Si substrate with a thermally oxidized film. Then, film formation by reactive sputtering of titanium oxide was carried out on the substrate at room temperature by applying a 150-W DC power to a mixed gas of 90% Ar and 10% $O_2$ at a pressure of 0.5 Pa. Thus, a $TiO_x$ layer having a film thickness of 40 nm was deposited (FIG. 3(a)). The 40-nm film thickness of the $TiO_x$ layer was selected considering the resistance value and the driving voltage; however, sufficient function was confirmed using a film with a thickness of approximately 20 nm. Nevertheless, when a film was further thinned, the rectifying characteristics were observed to become unclear, possibly due to non-uniformity of the quality of the formed film.

Figure 4:
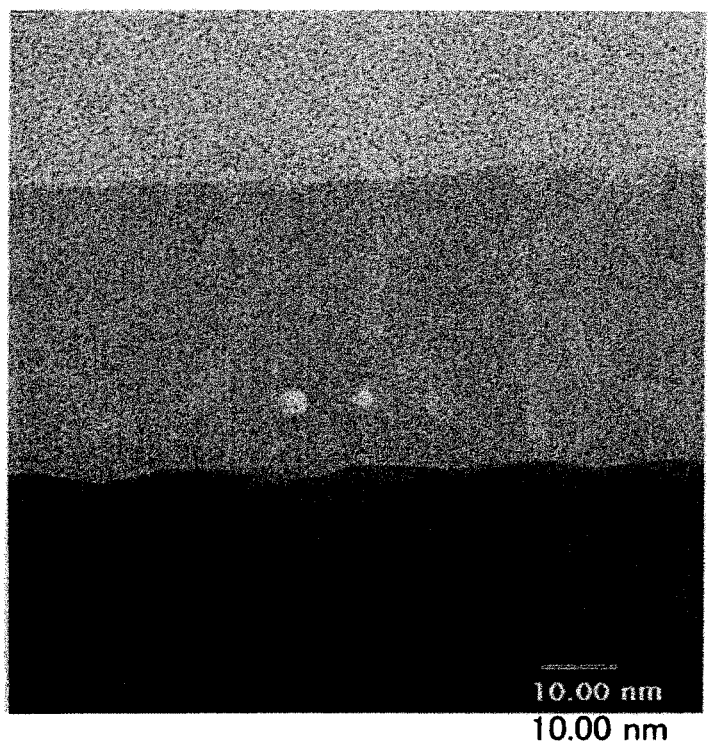
FIG. 4 shows a transmission electron micrograph of a cross-section of a substrate immediately after depositing a TiO$_x$ layer of the present invention.

The transmission electron micrograph of a cross-section of the substrate at this stage is shown in FIG. 4. The bottom black part of FIG. 4 is the Pt layer, and the middle gray part is the deposited titanium oxide layer. The two whitish circular regions in the $TiO_x$ layer are damaged areas caused by the electron beam irradiated for analysis (the electron beam diameter was 1 nm). Considering that the damages reached the surrounding region due to electron beam irradiation in this manner, a certain degree of fluctuation in the composition of titanium oxide is speculated. An oxygen deficit of about 20 percent on average with respect to the stoichiometric composition was observed. Herein, since no pattern suggesting a periodic structure or such was observed in FIG. 4, the $TiO_x$ layer was determined to be in an amorphous state.

Next, annealing treatment was carried out by heating the substrate to 200° C. and exposing it to an atmosphere assisted by radicals produced by applying a 100-W RF power to a mixed gas of 80% Ar and 20% $O_2$ at a pressure of 2 Pa. The surface of the $TiO_x$ layer is presumed to have a stoichiometric composition due to this procedure. As described above, since the $TiO_x$ layer is damaged by the electron beam irradiated for composition analysis, only the averaged composition of the $TiO_x$ layer can be actually measured, and the composition of the nanometer-order-thick surface exposed to oxygen atmosphere can only be estimated from the process.

The substrate was coated with photoresist, and exposed to light through a mask having a pattern of the top electrode, thus the regions other than the top electrode were coated with the photoresist. Then, a 100-W RF power was applied to 100% Ar at a pressure of 0.3 Pa to deposit 100-nm-thick Pt. The temperature of the substrate at this time was room temperature. Subsequently, excess Pt was lifted off by etching the photoresist, and the deposited Pt was patterned into the shape of the top electrode (FIG. 3(b)).

Furthermore, by using the Pt top electrode as the etching mask, the $TiO_x$ layer was etched until Pt of the lower electrode became exposed by the reactive ion etching method to produce the element structure shown in FIG. 3(c).

FIG. 1(a) mentioned above is a transmission electron microscope photograph of the titanium oxide layer interposed between the top electrode and the bottom electrode. Since no pattern suggesting a periodic structure or such was observed in FIG. 1(a) as with FIG. 4, it was presumed that the $TiO_x$ layer formed after depositing the top electrode was also in an amorphous state.

Figure 5:
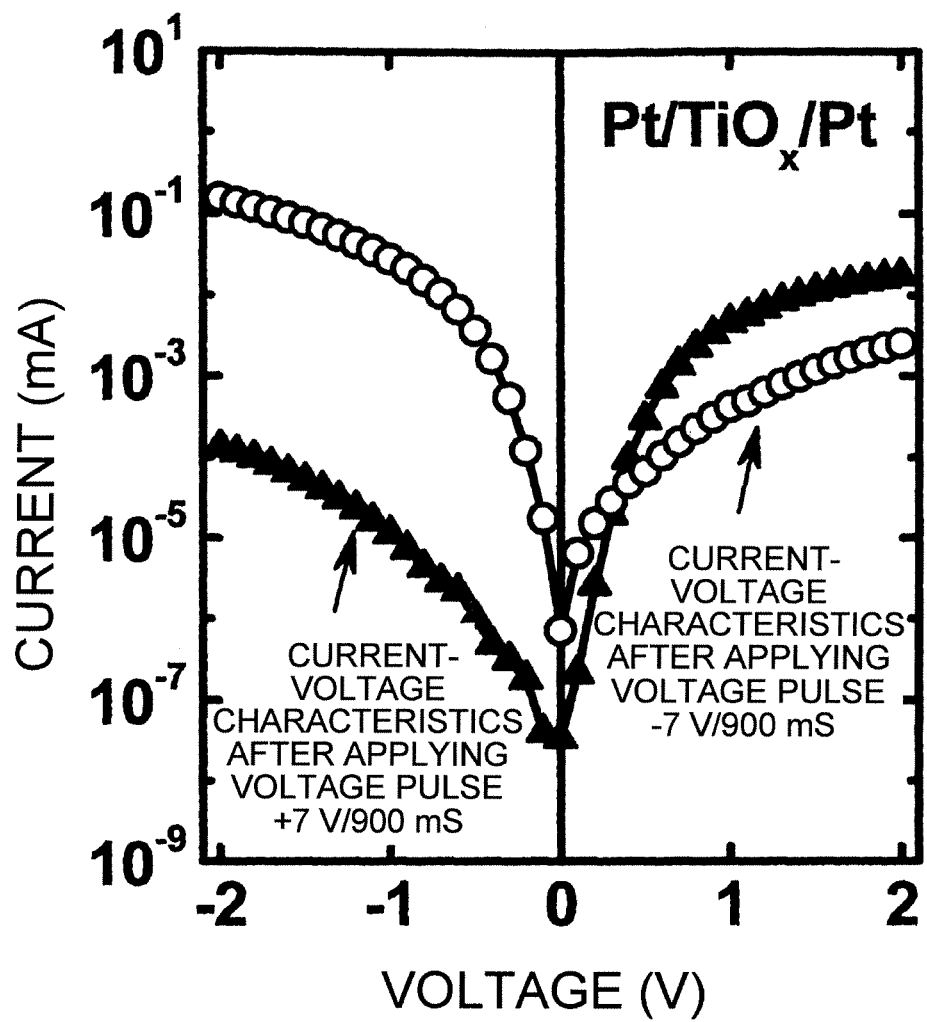
FIG. 5 shows the current-voltage characteristics after applying a reverse electrical signal to the rectifier element according to Example 1 of the present invention.

When a voltage pulse signal of −7 V/900 ms was applied between the two electrodes of the rectifier element thus produced, changes in the current value as indicated with open circles in FIG. 5 were observed during the subsequent voltage sweep in the range of −2 V to +2 V. On the other hand, when the polarity of the voltage applied between the two electrodes was reversed and a pulse signal of +7 V/900 ms was applied, changes in the current value as indicated with filled triangles in FIG. 5 were observed during the voltage sweep in the range of −2 V to +2V subsequent to the application.

Figure 6:
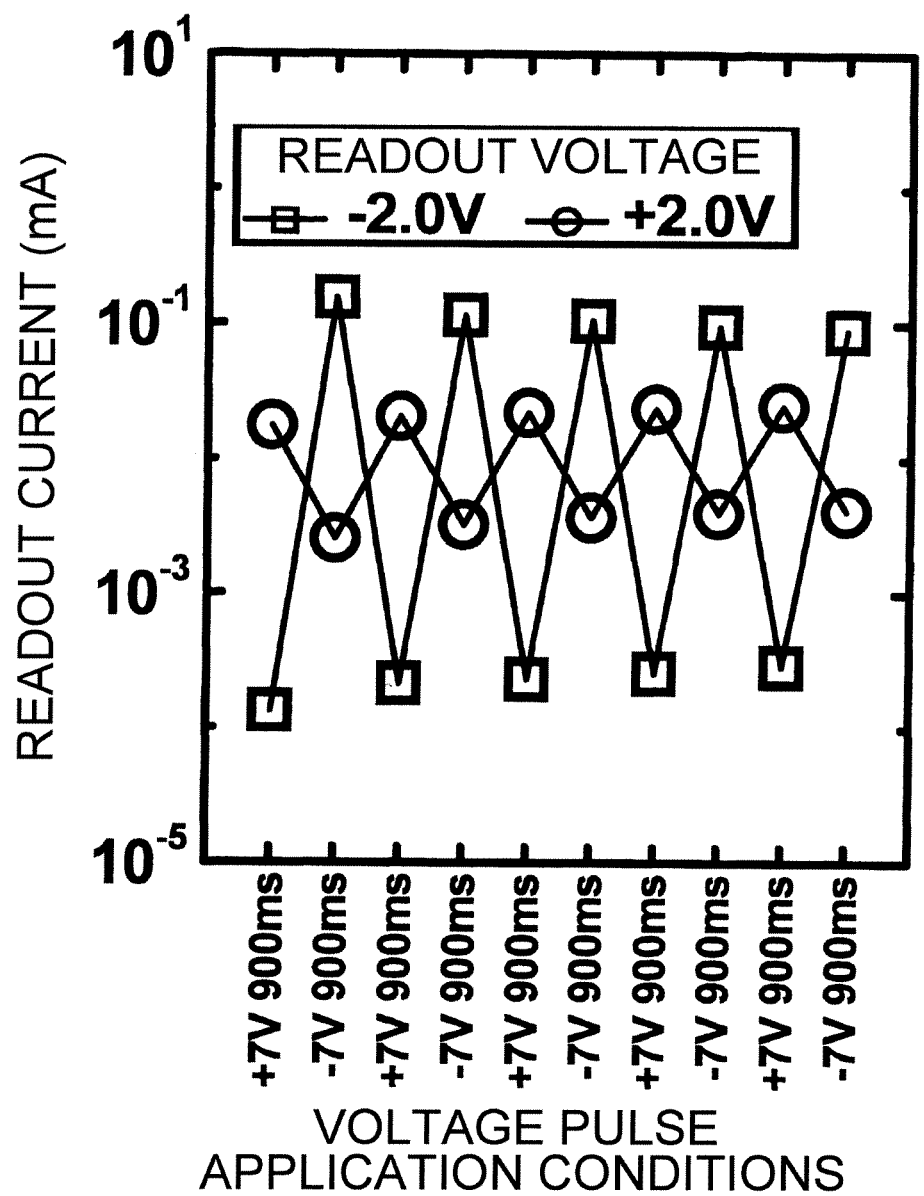
FIG. 6 shows the reproducibility of the reverse characteristics of the rectifier element according to Example 1 of the present invention.

Furthermore, FIG. 6 is a summary of the reversal of the rectifying characteristics when the above-mentioned reversal was repeated. Specifically, current values were measured when reverse electrical signals of +7 V/900 ms and −7 V/900 ms were alternately applied between the two electrodes, and a readout voltage of +2 V or −2 V was applied. Excellent reversibility of rectifying characteristics was confirmed.

Example 2

The substrate was coated with photoresist, and exposed to light through a mask having a pattern of the top electrode, thus the regions other than the top electrode were coated with the photoresist. Then, a 100-W RF power was applied to 100% Ar at a pressure of 0.3 Pa to deposit 100-nm-thick Au. The temperature of the substrate at this time was room temperature. Subsequently, excess Au was lifted off by etching the photoresist, and the deposited Au was patterned into the shape of the top electrode.

Figure 7:
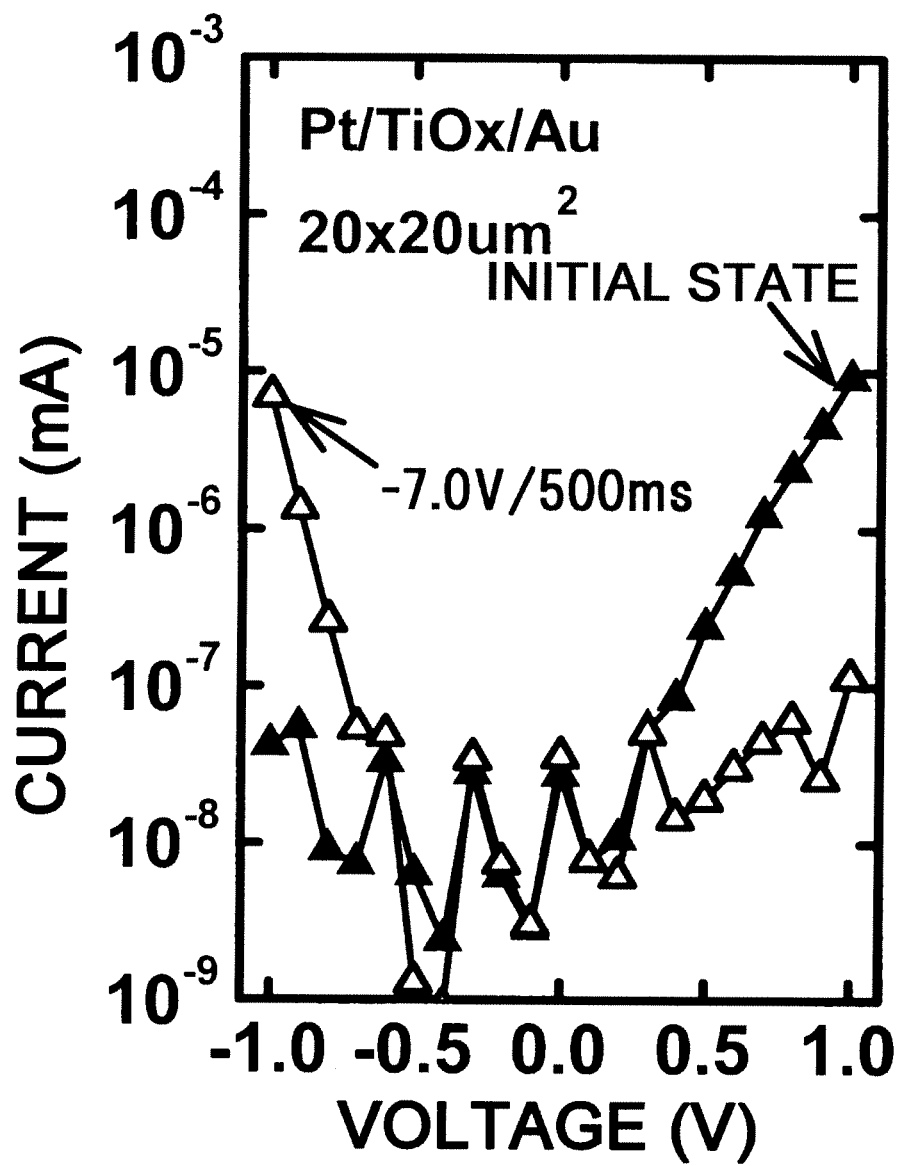
FIG. 7 shows the current-voltage characteristics after applying a reverse electrical signal to the rectifier element according to Example 2 of the present invention.

When a voltage pulse signal of −7 V/500 ms was applied between the two electrodes of the rectifier element thus produced, changes in the current value as indicated with open triangles in FIG. 7 were observed during the subsequent voltage sweep in the range of −2 V to +2 V. Compared to the changes in the current value for the initial state indicated with filled triangles in FIG. 7, excellent reversibility of rectifying characteristics was confirmed.

Example 3

The substrate was coated with photoresist, and exposed to light through a mask having a pattern of the top electrode, thus the regions other than the top electrode were coated with the photoresist. Then, a 100-W RF power was applied to 100% Ar at a pressure of 0.3 Pa to deposit 100-nm-thick Cu. The temperature of the substrate at this time was room temperature. Subsequently, excess Cu was lifted off by etching the photoresist, and the deposited Cu was patterned into the shape of the top electrode.

Figure 8:
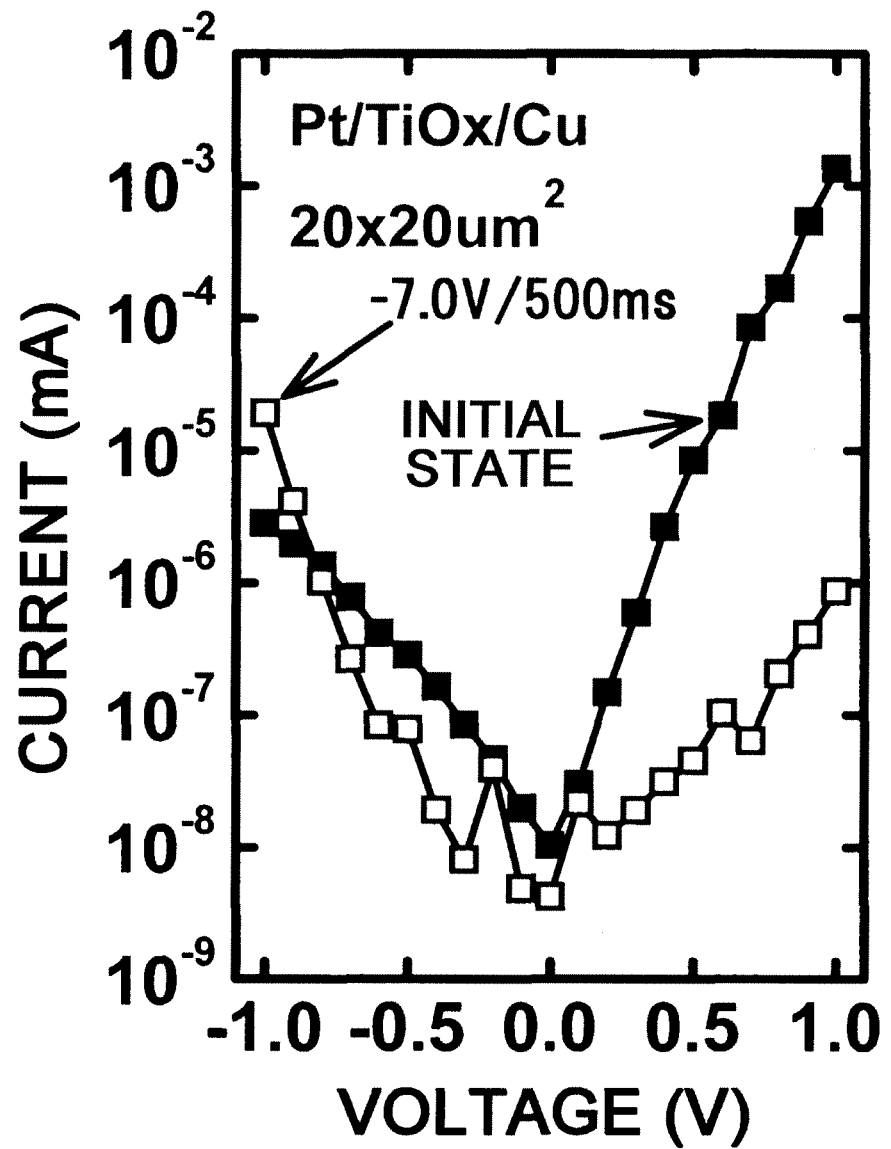
FIG. 8 depicts the current-voltage characteristics after applying a reverse electrical signal to the rectifier element according to Example 3 of the present invention.

When a voltage pulse signal of −7 V/500 ms was applied between the two electrodes of the rectifier element thus produced, changes in the current value as indicated with open squares in FIG. 8 were observed during the subsequent voltage sweep in the range of −2 V to +2 V. Compared to the changes in the current value for the initial state indicated with filled squares in FIG. 8, excellent reversibility of rectifying characteristics was confirmed.

In Examples 1 to 3, Pt, Au, and Cu were described as examples of the top electrode and Pt was described as an example of the bottom electrode of the rectifier elements of the present invention. However, the electrodes of the present invention are not limited thereto, as long as they contain a transition metal with an electronegativity larger than that of Ti, and the valence electrons and interelectronic interaction in the metal used as the electrode are maintained at the interface contacting with TiO$_x$, and the metal does not form a reactive layer that causes the rectifying characteristics to be absent due to binding of metal cations with oxygen ions.

INDUSTRIAL APPLICABILITY

As described above, the present invention provides rectifying diodes that use a functional oxide semiconductor whose rectifying characteristics can be optionally regulated by providing an electrical signal to the elements even after they are produced. When the rectifier elements of the present invention are incorporated into devices, the rectifying characteristics can be altered after production. Therefore, applicability of the devices is expected to be dramatically improved, since users can now partially customize the hardware itself, whereas until now alteration of device specifications was limited to customization using software only.

The invention claimed is:

1. A rectifier element comprising a titanium oxide layer interposed between first and second electrodes comprising a transition metal with an electronegativity larger than that of Ti, wherein, in the titanium oxide layer, only the interface on the side facing any one of the electrodes has a stoichiometric composition;

wherein the average composition of the whole layer is represented by the formula TiO$_x$ (wherein x satisfies the relationship $1.6 \leq x \leq 2$); and wherein the rectifying characteristics can be reversed by applying a reverse electrical signal that exceeds the critical reverse electric power between the first and second electrodes in an opposite direction.

2. The rectifier element of claim 1 wherein the first electrode comprises Pt.

3. The rectifier element of claim 1 wherein the second electrode comprises Pt.

4. The rectifier element of claim 2 wherein the second electrode comprises Au.

5. The rectifier element of claim 2 wherein the second electrode comprises Cu.

* * * * *

UNITED STATES PATENT AND TRADEMARK OFFICE
CERTIFICATE OF CORRECTION

PATENT NO.         : 8,487,415 B2
APPLICATION NO.    : 12/740460
DATED              : July 16, 2013
INVENTOR(S)        : Hisashi Shima et al.

It is certified that error appears in the above-identified patent and that said Letters Patent is hereby corrected as shown below:

In the Claims

Claim 1, Column 8, line 6, delete "relationship $1.6 \leqq x \leqq 2$" and insert -- relationship $1.6 \leq x < 2$ --.

Signed and Sealed this
Thirty-first Day of December, 2013

Margaret A. Focarino
*Commissioner for Patents of the United States Patent and Trademark Office*